(12) United States Patent
Loewenstein

(10) Patent No.: US 9,160,370 B2
(45) Date of Patent: Oct. 13, 2015

(54) SINGLE COMPONENT CORRECTING ECC USING A REDUCIBLE POLYNOMIAL WITH GF(2) COEFFICIENTS

(71) Applicant: Oracle International Corporation, Redwood City, CA (US)

(72) Inventor: Paul N. Loewenstein, Palo Alto, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 102 days.

(21) Appl. No.: 14/146,496

(22) Filed: Jan. 2, 2014

(65) Prior Publication Data

US 2015/0188571 A1    Jul. 2, 2015

(51) Int. Cl.
*H03M 13/00*   (2006.01)
*H03M 13/15*   (2006.01)

(52) U.S. Cl.
CPC .................................. *H03M 13/151* (2013.01)

(58) Field of Classification Search
CPC . H03M 13/2909; H03M 13/09; H03M 13/13; H03M 13/134; H03M 13/19
USPC ......................................................... 714/755
See application file for complete search history.

(56) References Cited

U.S. PATENT DOCUMENTS

| | | | | |
|---|---|---|---|---|
| 6,598,202 | B1 * | 7/2003 | Kim et al. ...................... | 714/786 |
| 7,188,296 | B1 | 3/2007 | Cypher | |
| 8,335,961 | B2 | 12/2012 | Cypher | |
| 8,468,416 | B2 * | 6/2013 | Gara et al. ..................... | 714/758 |
| 8,621,290 | B2 * | 12/2013 | Daga et al. .................... | 714/710 |
| 2002/0152444 | A1 * | 10/2002 | Chen et al. ..................... | 714/785 |
| 2007/0266274 | A1 * | 11/2007 | Lin ................................ | 714/699 |
| 2009/0292968 | A1 * | 11/2009 | Cypher ......................... | 714/755 |
| 2011/0289368 | A1 * | 11/2011 | Daga et al. .................... | 714/711 |

OTHER PUBLICATIONS

Moreira, Jorge Castineira et al. "Essentials of Error-Control Coding" 2006, John Wiley & Sons, Ltd. ISBN: 0-470-02920-X, Appendix B: Galois Fields (GF)(q) pp. 239-249.

* cited by examiner

*Primary Examiner* — David Ton
(74) *Attorney, Agent, or Firm* — Park, Vaughan, Fleming & Dowler LLP

(57) ABSTRACT

A memory system is described that provides error detection and correction after a failure of a memory component. Each block of data in the memory system includes an array of bits logically organized into R rows and C columns, including C-2 data-bit columns containing data bits, a row check bit column including row-parity bits for each of the R rows in the block, and an inner check bit column including X inner check bits. The inner check bits are defined to cover bits in the array according to a set of check vectors, wherein each check vector is associated with a different bit in the array and is an element of Res(P), a residue system. Moreover, each column is stored in a different memory component, and the check bits are generated from the data bits to provide block-level detection and correction for both memory errors and a failed memory component.

20 Claims, 3 Drawing Sheets

SINGLE COMPONENT CORRECTING ECC USING A REDUCIBLE POLYNOMIAL WITH GF(2) COEFFICIENTS

BACKGROUND

1. Field

The disclosed embodiments generally relate to error detection and correction mechanisms in computer memories. The disclosed embodiments also use a technique that facilitates error detection and error correction after a failure of a memory component in a computer system.

2. Related Art

Computer systems routinely employ error-detecting and error-correcting codes to detect and/or correct various data errors which can be caused, for example, by noisy communication channels and unreliable storage media. Some error codes, such as SECDED Hamming codes, can be used to correct single-bit errors and detect double-bit errors. Other codes, which are based on Galois fields, can be used to correct a special class of multi-bit errors caused by a failure of an entire memory component. For example, see U.S. Pat. No. 7,188,296, entitled "ECC for Component Failures Using Galois Fields," by inventor Robert E. Cypher, filed 30 Oct. 2003 and issued on 7 Mar. 2007 (referred to as "the '296 patent"), which is incorporated herein by reference.

The operations described in the '296 patent are equivalent to operations on a class of polynomials with binary coefficients (referred to as "GF(2) polynomials") modulo a GF(2) polynomial that is irreducible (referred to as an "irreducible GF(2) polynomial"). However, having to use an irreducible GF(2) polynomial significantly limits the possible polynomials that can be used as the generating polynomial for a code. This limitation makes it harder to guarantee a minimum Hamming distance for the code, and this lack of a guaranteed minimum Hamming distance can make the code less useful for detecting and correcting errors in memory components.

Hence, what is needed is a method and an apparatus for detecting and correcting errors in a memory component without the shortcomings of existing techniques.

SUMMARY

The disclosed embodiments provide a memory system that can be reconfigured to provide error detection in a memory system and correction of errors within a single memory component. The disclosed embodiments also provide single-bit correction in any single memory component after one memory component has failed. Each block of data in the memory system includes an array of bits logically organized into R rows and C columns, including C-2 data-bit columns containing data bits, a row check bit column including row-parity bits for each of the R rows in the block, and an inner check bit column including $X \leq R$ inner check bits. The inner check bits are defined to cover bits in the array in accordance with a set of check vectors, wherein each check vector is associated with a different bit in the array and is an element of Res(P), a residue system comprising a set of polynomials with GF(2) coefficients modulo a polynomial P with GF(2) coefficients. Moreover, each column is stored in a different memory component, and the check bits are generated from the data bits to provide block-level detection and correction for errors in any number of bits confined to a single memory component.

During operation, the system accesses a block of data from the memory. Next, the system examines the block of data retrieved by the access mechanism, and then determines whether a memory component has generated an error based on the examination.

In some embodiments, while determining whether a memory component has generated an error, the system first reads the block of data, which includes data-bit columns, a row check bit column and an inner check bit column. Next, the system uses the data bits in the data-bit columns to regenerate the row-parity bits for the row check bit column and the inner check bits for the inner check bit column. The system then compares the regenerated row-parity bits and inner check bits with the existing row-parity bits and inner check bits, and determines whether a memory component has generated an error based on the comparisons.

DETAILED DESCRIPTION

Figure 1:
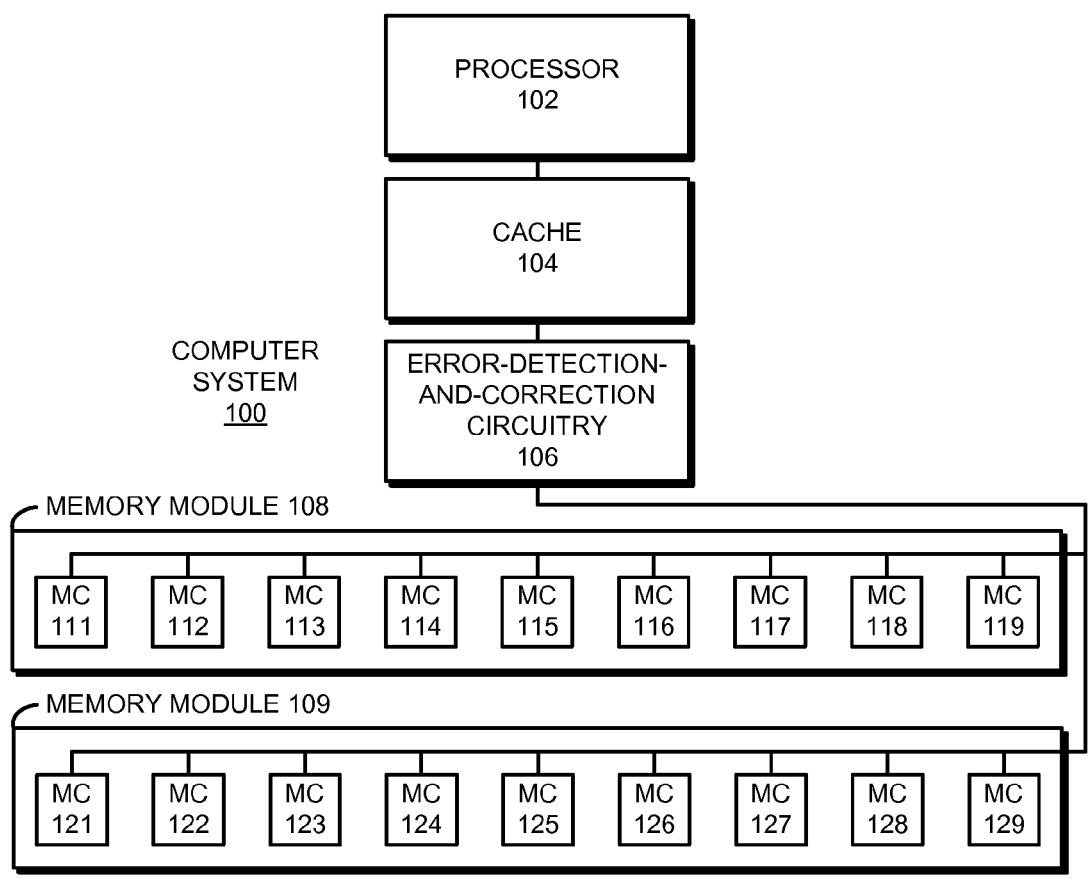
FIG. 1 illustrates a computer system in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Extensions to Previous Patents and Applications

This disclosure extends the work done in the '296 patent (cited above), and also the following patent applications, which are incorporated by reference herein to provide implementation details: U.S. Pat. No. 8,335,961, entitled "Facilitating Probabilistic Error Detection and Correction After a Memory Component Failure," filed Jun. 30, 2009 and issued Dec. 18, 2012, by inventors Robert E. Cypher and Bharat K. Daga (referred to as the '961 patent); U.S. patent application Ser. No. 12/782,580, entitled "Memory System that Supports Probabilistic Component-Failure Correction with Partial Component Sparing," filed May 18, 2010, by inventors Bharat K. Daga and Robert E. Cypher (referred to as the '580 application); U.S. Pat. No. 8,335,976, entitled "Memory System that Provides Guaranteed Component Failure Correction with Double Error Correction," filed May 24, 2010 and issued Dec. 18, 2012, by inventors Robert E. Cypher and Bharat K. Daga (referred to as the '976 patent); and U.S. patent application Ser. No. 13/565,430, entitled "Using a Data ECC to Detect Address Corruption," filed Aug. 2, 2012, by inventor Paul N. Loewenstein (referred to as the '430 application).

Before describing implementation details, we first discuss Galois fields and describe how reducible polynomials can be used in place of irreducible polynomials to facilitate error detection and correction.

Implementing Galois Field Arithmetic

Galois fields all have the size of a power of a prime number. A Galois field of size $p^n$ is denoted as $GF(p^n)$. The prime number p is the characteristic of the field. Most implementations are of Galois fields of characteristic 2, because these are particularly suited to binary digital circuits. A Galois field of prime size is isomorphic to integer arithmetic modulo that prime. $GF(p^n)$ can be constructed as operations on polynomials over $GF(p)$ modulo a degree n irreducible polynomial with coefficients $\in GF(p)$.

All non-zero elements of the field can be described as powers of a primitive element $a \in GF(p^n)$. It is convenient but not required to use a primitive polynomial for the modulus. A primitive polynomial modulus conveniently allows a to be represented as the degree-1 polynomial x+0. Regardless of the polynomial chosen for the modulus, all representations of a Galois field of a given size are isomorphic to each other. It is this property that allows a Galois field of size q to be unambiguously denoted as $GF(q)$.

Let a $GF(2)$ polynomial be represented as $a_n x^n + a_{n-1} x^{n-1} \ldots a_1 x^1 + a_0$. The '296 patent, the '580 application, the '976 patent and the '430 application imply that the Galois field arithmetic is implemented by representing the elements as $GF(2)$ polynomials, storing the polynomials as multi-bit binary values with bit m representing $a_m$. Such representation is standard practice.

Using Reducible Polynomials

The operations in $GF(2^x)$ described in the '296 patent, the '580 application, the '976 patent and the '430 application are equivalent to operations on $GF(2)$ polynomials modulo a degree-x $GF(2)$ irreducible polynomial. This disclosure shows how equivalent functionality can be obtained using operations on $GF(2)$ polynomials modulo a reducible polynomial, thus working around the '296 patent. Reducible polynomials can also have advantages over irreducible polynomials, as described below.

Key and Check Vector Generation

As in the '296 patent, we arrange the check bits with the data to be protected as an array with R rows and C columns. (See '296 patent, FIG. 3.) (Please note that the '296 patent uses the variable label N to represent the number of columns, whereas the present disclosure, the '961 patent, the '976 patent, the '580 application and the '430 application use the variable label C to represent the number of columns.)

Let P be a reducible polynomial over $GF(2)$ of degree R with the coefficient $a_0=1$. Some embodiments use check vectors of the form $x^k$ mod P. It should be noted that no check vector (viewed as a $GF(2)$ polynomial) shares a common factor k with P, because x shares no common factor with P. A typical embodiment has $k=r+R(c-1)$, where r is the row number and c is the column number shown in the '296 patent, FIG. 4.

Identifying a with the polynomial x+0, the check vectors for r=0 correspond to the column keys in the '296 patent, except that because P is reducible, the keys and check vectors cannot be regarded as elements of a Galois field.

It should be noted that the check vector generation scheme is the same check vector generation process as is used for a cyclic redundancy code (CRC) over columns 1 through C-1, using P as the generating polynomial. It is common practice to use reducible polynomials as CRC generating polynomials.

Check Bit and Syndrome Generation

The row check bits are calculated as in the '296 patent. Moreover, the column check bits are calculated as in the '296 patent, using the check vectors calculated above. Also, the row syndrome is calculated as in the '296 patent. The inner syndrome is similarly calculated as in the '296 patent.

Single Component Error Correction

Because the syndromes and column keys are not elements of a Galois field, division is not in general defined. We cannot, therefore, divide the inner syndrome (modulo P) by the row syndrome to determine the column key of the component in error. However, multiplication is defined (it is polynomial multiplication modulo P). We can, therefore, multiply each column key by the row syndrome and compare the result with the inner syndrome.

Because P is reducible, however, an inappropriate choice of P can lead to multiple column key-row syndrome products matching the inner syndrome. This would make it impossible to correct a single-component error. With row syndrome $S_r$, there can be ambiguity between columns x and y with column keys $k_x$ and $k_y$ respectively if:

$$k_x x_P S_r = k_y x_P S_r$$

where $x_P$ denotes $GF(2)$ polynomial multiplication modulo P. Using the distributive law, we get:

$$(k_x - k_y) x_P S_r = 0,$$

which holds if $(k_x - k_y) x_P S_r$ is divisible by P, where x denotes $GF(2)$ polynomial multiplication. This can only be true if either.

1. $S_r$ is divisible by P, or
2. $k_x - k_y$ has a factor in common with P.

Condition 1 implies that the degree of P is less than R. This means we are using the probabilistic component-error correction described in the '580 application and we have a row syndrome that prevents the determination of the component in error. That the polynomial is reducible or irreducible makes no difference.

Condition 2 is avoidable by careful choice of P. We select P such that no $k_x - k_y$ shares a common factor with P. For embodiments with $2^i$ rows and 18 columns and using check vectors derived as for the typical embodiment above, the forbidden factors of P are: 0x3, 0x7, 0xb, 0xd, 0x13, 0x19, 0x1f, 0x49, 0x7ff and 0x1fff (representing polynomials as binary numbers as described earlier). These factors are independent of the number of rows provided that the column keys for column c (c>0) are of the form $x^{(c-1)2^S}$ mod P, where $2^S \geq R$.

A forbidden factor of significance is 0x3, which is often used to increase the Hamming distance of CRCs. Such a factor in a CRC generating polynomial causes the weight of each check vector to be odd, so that any odd number of errors in the code word is guaranteed to be detected. Such a use of a 0x3 factor is forbidden for the memory ECC codes covered here.

Multi-Bit Detection and Correction Across Components

Double-Error Detection

Two Errors in the Same Row

This gives a zero row syndrome, so it cannot be confused with a single-chip error. Because all check vectors are different, the sum (exclusive-OR) of two check vectors cannot be zero, so double errors are detected.

Two Errors in Different Rows

We need to ensure that two errors in different columns and different rows never give the same inner syndrome as two errors in the same column (so it cannot be confused with a correctable error in a single component). There are two cases that do not correspond to single-component errors.

(1) One error is in the row check bit column. This results in the inner syndrome having the value of the check vector of the other bit in error. If the Hamming distance of the code defined by the generating polynomial is at least 4, then this cannot correspond to any double-bit error, otherwise, triple errors would not be detected as implied by a Hamming distance of 4. Note that this Hamming distance is sufficient but not necessary, because the double error it should not be confused with is constrained to a single column and the same rows.

(2) Neither error is in the row check bit column. If the Hamming distance of the code defined by the generating polynomial is at least 5, then this cannot correspond to a single-component double error, because then the code would not detect quad errors as implied by the Hamming distance. Note that this Hamming distance is sufficient but not necessary, because the double error with which it should not be confused is constrained to a single column and the same rows.

Double-Error Correction

In addition to not confusing the double error with a double error in a single column, we should also not confuse the error with another double error (so that the double errors can be distinguished for correction).

It should be noted that in systems where avoidance of data corruption is paramount, such as in computer memories, if errors are sufficiently common as to warrant double-error correction across components, then it is likely that the code needs to be sufficiently robust to detect triple errors across components.

Two Errors in the Same Row

There are two cases.

(1) One error is in the row check bit column. In this case we should not confuse the error with another double error in the same row. Because the check vectors are all different, we cannot confuse it with another double error with one of the bits in the row check bit column. With a Hamming distance of at least 4, we cannot confuse it with another double error in the same row. Note that this Hamming distance is sufficient but not necessary, because the double error with which it should not be confused is constrained to the same rows by the row syndrome.

(2) Neither error is in the row check bit column. With a Hamming distance of 4, we have already seen that we cannot confuse this with a double error where one of the errors is in the row check bit column. With a Hamming distance of 5, it cannot be confused with any other double error. Note that this Hamming distance is sufficient but not necessary, because the double error it should not be confused with is constrained to the same rows by the row syndrome.

Two Errors in Different Rows

There are two cases that do not correspond to single-component errors.

(1) One error is in the row check bit column. This results in the inner syndrome having the value of the check vector of the other bit in error. If the Hamming distance of the code defined by the generating polynomial is at least 4, then this cannot correspond to any double-bit error, otherwise, triple errors would not be detected as implied by a Hamming distance of 4. Note that this Hamming distance is sufficient but not necessary, because the double error it should not be confused with is constrained to the same rows by the row syndrome.

(2) Neither error is in the row check bit column. If the Hamming distance of the code defined by the generating polynomial is at least 5, then this cannot correspond to any other double error, because then the code would not detect quad errors as implied by the Hamming distance. Note that this Hamming distance is sufficient but not necessary, because the double error it should not be confused with is constrained to the same rows by the row syndrome.

Triple-Error Detection

Whether there is an odd or even number of errors can be unambiguously determined from the row syndrome. So there is no possibility of confusing triple errors with double errors.

Three Errors in the Same Row

All these cases have a single bit set in the row syndrome, and so should not be confused with single-bit errors. There are two cases:

(1) One error in the row check bit column. This gives an inner syndrome that corresponds to a double error. A Hamming distance of 4 is sufficient to distinguish this double error from a single correctable error.

(2) No error in the row check bit column. This gives an inner syndrome that corresponds to a triple error. A Hamming distance of 5 is sufficient to distinguish this double error from a single correctable error.

Two Errors in the Same Row

These errors involve two different rows: a row with a single error (the singleton row) and a row with a double error (the pair row). All these cases have a single bit set in the row syndrome, and so should not be confused with single-bit errors. There are four cases:

(1) Two errors in the row check bit column. The row syndrome has a single 1 in the singleton row. This results in a single-error inner syndrome, for an error in the pair row. A Hamming distance of 3 is sufficient for this not to be confused with a single-bit error in the singleton row.

(2) The singleton row error in the row check bit column. This results in a double-error inner syndrome for the pair row. A Hamming distance of 4 is sufficient for this not to be confused with a single bit error in the singleton row.

(3) A pair row error in the row check bit column. This results in a double-error inner syndrome. A Hamming distance of 4 is sufficient for this not to be confused with a single error in the pair row.

(4) No error in the row check bit column. A Hamming distance of 5 is sufficient for this case.

All Three Errors in Different Rows

These errors are distinguished by 3 bits set in the row syndrome. They should, therefore, not be confused with single-component correctable triple errors.

(1) Two errors in row check bit column. This results in a single-error inner syndrome, for an error in the pair row. A Hamming distance of 5 is sufficient for this not to be confused with a triple-bit error in a single component.

(2) One error in row check bit column. This results in a double-error inner syndrome, for an error in the pair row. A Hamming distance of 6 is sufficient for this not to be confused with a triple-bit error in a single component.

(3) No error in row check bit column. This results in a triple-error inner syndrome, for an error in the pair row. A Hamming distance of 7 is sufficient for this not to be confused with a triple-bit error in a single component.

Choice of Generating Polynomial

Allowing reducible as well as irreducible generating polynomials provides a wider choice of polynomial. In particular, it allows the choosing of polynomials that generate codes with a guaranteed minimum Hamming distance, such as those that generate Bose Ray-Chaudhuri Hocquenghem (BCH) codes.

As an example, let us assume 18 columns and 32 rows; after subtracting the row check bit column, this leaves 17×32=544 bits to be covered by the column check bits. The next power of 2 greater than 544 is 1024=$2^{10}$. Using known techniques, we can construct a BCH code of Hamming distance 7 using a generating polynomial that is a product of 3 (suitably selected) degree-10 irreducible polynomials. However, for guaranteed single-column error correction, we need 32 column check bits, so we need to introduce an additional degree-2 polynomial as a factor. There is only one irreducible degree-2 GF(2) polynomial: $x^2+x+1$ (represented as 0x7). We should ensure that we choose column keys such that no $k_i-k_j$ is divisible by 0x7. However, this is not possible, because $x^n+1$ is divisible by $x^2+x+1$ for all n divisible by 3. It is not possible to have a set of more than 3 different n where the differences between the n are all indivisible by 3. We are, therefore, limited to 30 column check bits, which could be used in a probabilistic component error correction as in the '580 application. As shown above, such a code has guaranteed triple-error detection and can also support double-error correction or detection.

It should again be emphasized that codes with lesser Hamming distances may allow triple-error detection and double-error correction or detection. However, these codes may need to be checked for these properties explicitly by searching through the error cases rather than having these properties guaranteed by construction. A 32-bit polynomial could be constructed as a product of 2 16-bit polynomials. A BCH code constructed this way guarantees a Hamming distance of 5. Thus, only the last two triple-error cases above need to be checked explicitly when using such a polynomial.

Syndrome Calculation and Decoding

Next, we discuss how syndromes are calculated and decoded. The row syndrome $S_r$ is calculated by XORing (GF(2) addition) the received row check bits with row check bits recalculated from the other received columns. Moreover, the inner syndrome $S_i$ is calculated by XORing (GF(2) addition) the received inner check bits and check bits recalculated from the received data bits. In the following discussion, let $k_c$ be the column key for column c.

No Known Failed Component

We first cover the situation where there is no known failed component. In this case, if $S_r$=0 and $S_i$=0, then we have no error. Otherwise, if $S_r$ mod P=0, we have an uncorrectable error. (Note that this can only be true if the degree of P is less than R, implying probabilistic single component error correction.) Otherwise, if for some column c, $(S_r \bmod P) x_P k_c = S_i$, then we have a correctable error in component c, which can be corrected by exclusive-ORing column c with $S_r$. Otherwise (if we find no such column), we have an uncorrectable error.

Known Failed Component

We next cover the case where there exists a known failed component. In this case, let F be the column index of the known failed component and let a be the polynomial x+0. If $S_r$=0 and $S_i$=0, then we have no error. Otherwise, if there is an error, we attempt to correct the error by exclusive-ORing column F with $S_r$. Note that this also works for the no error case, should we not wish to check. If $((S_r \bmod P) x_P k_c) = S_i$, then the correction was successful.

Otherwise, if for some row r and column r:

$$a^r x_P (k_c + k_F) = ((S_r \bmod P) X_P k_F) + S_i$$

then we have a single-bit error in row r and column c. To correct this, we invert the bits corresponding to column c and column F in row r. Otherwise, we have an uncorrectable error. Note that this determination is equivalent to recalculating the inner syndrome after XORing the row syndrome with the received bits in failed component column, and then determining if that syndrome is compatible with a double-bit error confined to one row and with one of the bits being in the failed component column.

This ability to correct an additional single-bit error depends on single-row, double-bit errors all having distinct inner syndromes. The inner syndrome code having a Hamming distance of 5 is sufficient but not necessary for this to hold. With an inner syndrome code Hamming distance of 7, no double-bit error can be confused with a single-bit error, and we also have double-error detection. Again, the Hamming distance is sufficient, but not necessary.

Implementation Details

We next describe implementation details for a system that facilitates error detection and correction using a reducible polynomial with GF(2) coefficients. One embodiment provides a mechanism for detecting and probabilistically correcting with very high probability multi-bit errors within a single memory component, caused for example by the failure of a communication or memory component (such as the failure of a DRAM chip). Moreover, when it cannot correct a component error, it is able to determine that it cannot perform the correction (thus, it never causes data corruption due to a failed attempt to correct a component error). In addition, once a failed component has been identified, it subsequently corrects all errors in the given component, plus any single-bit error in any other component.

The ability to correct single-bit errors in addition to the errors in the failed component is advantageous because it facilitates: (1) the correction of latent single-bit errors after a DRAM chip failure occurs; and (2) continued operation with a failed DRAM chip while providing SEC without remapping the data. Finally, the code is very efficient in terms of the number of check bits required. For example, if 18×8 DRAM chips with a burst length of 4 are used to store a 64B cache line plus 12 bits of metadata, the code can be used to provide a probability of approximately $(1-\frac{1}{2}^{20})$ of correcting a random multi-bit error within a memory chip, such as could be caused by chip failure.

Figure 2A:
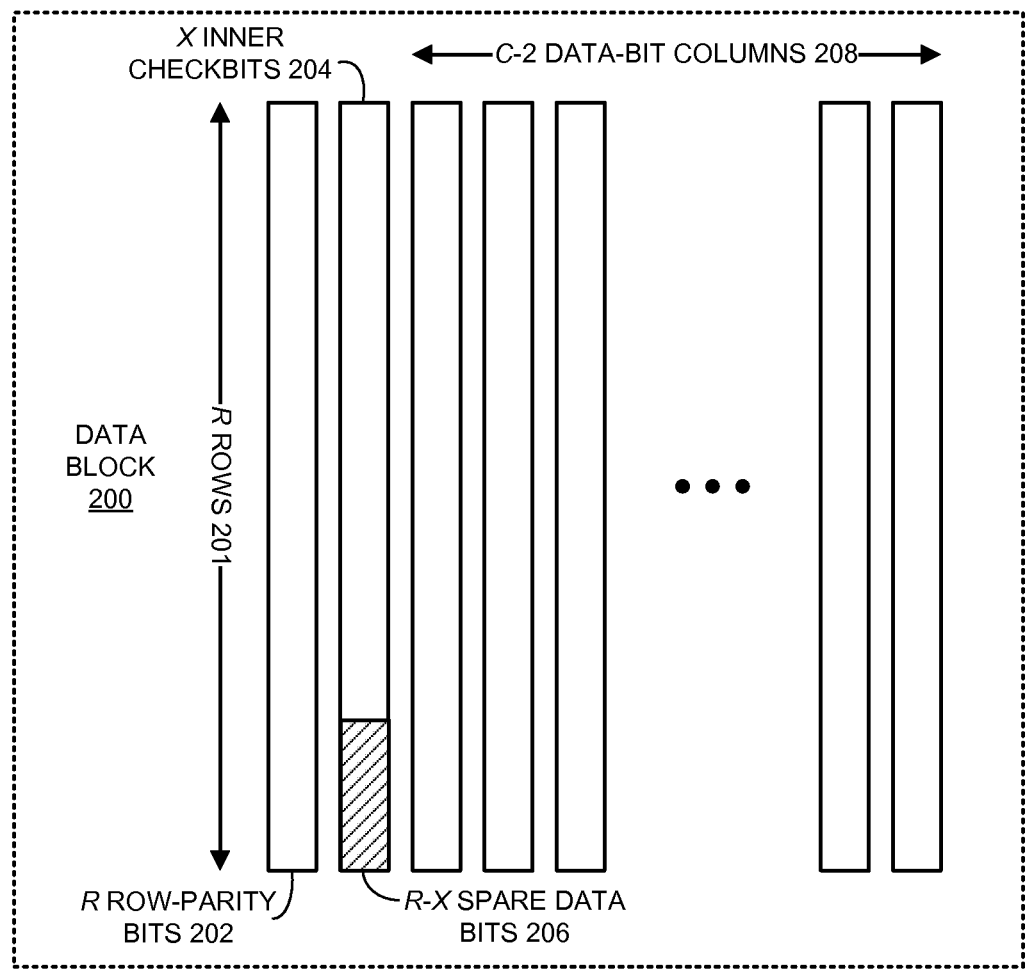
FIG. 2A illustrates a data block in accordance with the disclosed embodiments.

Referring to FIG. 2A, in one embodiment, the memory system accesses blocks of data (e.g., cache lines). Each of these blocks is logically organized into C sets of R bits each, which are viewed as forming an array with R rows and C columns, such that the bits affected by errors within a single component are located in a single column. For example, if 576 bits are stored on 18 DRAM chips, with 32 bits per DRAM, the bits can be viewed as forming a 32×18 array, wherein the bits stored on a single DRAM comprise a single column of the array. In this example, the rows are numbered 0 through R-1 and the columns are numbered 0 through C-1.

Column 0 and column 1 include check bits. More specifically, column 0 contains "row-parity check bits" 202, wherein the row-parity check bit stored in position (r, 0) is the even parity of the bits stored in position (r, c), where $1 \leq c \leq C-1$. Column 1 contains $X \leq R$ inner check bits 204 and R−X spare data bits 206. The X inner check bits 204 are used for component error correction with a probability of $(1-2^{-X})/(1-2^{-R})$ for a uniformly random error pattern within the component. It should be noted that most soft errors and errors caused by many component failure modes (such as pin failure) are by no means uniformly random, and can be guaranteed to be corrected even for X<R.

Associated with each column c, $0 \leq c \leq C-1$, is a unique key, $key_c$, which is an element of Res(P), a residue system comprising a set of polynomials with GF(2) coefficients modulo a polynomial P with GF(2) coefficients. Moreover, each inner check bit is the even parity of a subset of the R*C bits in a block. Specifically, the bit in location (r, c) is in the subset of bits covered by inner check bit i, $0 \le i \le X-1$, iff bit i of $(key_c * a^r)=1$, where the multiplication is in Res(P) and a is an element of Res(P). Correction of component errors can be accomplished by guessing (in parallel) that each column contains the error, calculating the inner syndrome that results from that guess, and checking the calculated inner syndrome against the true inner syndrome.

In addition, once a failed component has been identified, SCC (single-component correction) can be performed to correct arbitrary errors generated by the previously identified failed component. At this point, if there was a single-bit error in the original data (in addition to the component errors), there is now a double-bit error where both bits in error are in the same row and one is in the column corresponding to the failed component. (Note that this second error is "projected" into the failed component by the attempt to correct the failed component.) Next, the system calculates the inner syndrome of the resulting data and, if it is nonzero, corrects these remaining two errors by flipping those bits that yield this unique nonzero inner syndrome (assuming the given failed component).

To enable SEC with an identified failed component $c_f$, $0 \le c_f \le C-1$, it is necessary to guarantee that for each $r_1$, $0 \le r_1 \le R-1$, and $c_1$, $0 \le c_1 \le C-1$, inner_syndrome$(r_1,c_1)$ XOR inner_syndrome$(r_1,c_f)$ is unique for $c_1 \ne c_f$ (and, thus, the inner syndrome can be used for SEC). If either $c_1=0$ or $c_f=0$, then this is true if the Hamming distance of the code generating the inner syndrome is at least 3. If neither $c_1=0$ nor $c_f=0$, then a Hamming distance of 5 suffices for guaranteeing this property. Note that these Hamming distances are sufficient but not necessary.

Note that inner check bit i, $0 \le i \le X-1$, can be stored in location (i, 1) by selecting $key_1=1$. The selection of unique keys guarantees that all single-bit errors will have a unique syndrome and thus can be corrected. Also, note that by selecting $key_0=0$, the inner check bits do not cover the row check bits; thus, there is no circularity in their definition.

In the above analysis, it was assumed that the inner syndrome is a random member of Res(P). Note that many likely errors, such as errors caused by failure of a single pin of the component, may be guaranteed to produce a nonzero inner syndrome. Finally, note that once errors encountered by one or more memory accesses trigger a determination that a component has failed, subsequent memory accesses can use the known failed component ID to guarantee correction of further errors on that component.

The above-described technique is described in more detail below, but first we describe an exemplary computer system.

Computer System

FIG. 1 illustrates a computer system 100 in accordance with the described embodiments. Computer system 100 can generally include any type of computer system, including, but not limited to, a computer system based on a microprocessor, a mainframe computer, a digital signal processor, a portable computing device, a personal organizer, a cell phone, a device controller, or a computational engine within an appliance. Computer system 100 includes at least one processor 102, a cache memory 104, error-detection-and-correction circuitry 106 and memory modules 108 and 109. Processor 102 can include any type of computational engine that executes code and manipulates data. Cache memory 104 can include one or more caches or levels of caches, which store blocks of data (cache lines) which have recently been accessed or are likely to be accessed in the near future.

Error-detection-and-correction circuitry 106 includes circuitry that performs error-correction and error-detection operations for blocks of data which are retrieved from memory modules 108-109 and which are stored in cache memory 104. Note that the error-correction and error-detection operations can additionally (or alternatively) be performed when blocks of data in cache memory 104 are accessed by processor 102 from cache memory 104. One embodiment of error-detection-and-correction circuitry 106 is described in the '296 patent.

Memory modules 108 and 109 include memory components, which can be semiconductor chips containing random-access memory. More specifically, memory module 108 includes memory components (MCs) 111-119 and memory module 109 includes MCs 121-129.

Block Structure

As mentioned above, FIG. 2A illustrates the structure of a data block 200 in an exemplary memory system, which contains a codeword for a code that facilitates error correction and error detection in accordance with the described embodiments. Note that data block 200 includes an array of bits logically organized into R rows and C columns. The C columns include (1) a row check bit column containing row-parity bits 202 for each of the R rows, (2) an inner-check bit column containing $X \le R$ inner check bits 204 and R–X spare data bits 206, and (3)C-2 data-bit columns 208 containing data bits. An exemplary embodiment uses the parameters R=32, C=18, X=24, and R–X=8. Moreover, each column is stored in a different memory component, and the check bits are generated from the data bits to provide block-level detection and correction for errors within a single memory component. The row check bit column contains a row-parity bit for each of the R rows in the block. In contrast, the inner-check bit column contains inner check bits defined to cover bits in the array in accordance with a set of check vectors, wherein each check vector is associated with a different bit in the array and is an element of the reduced residue system modulo a degree-X GF(2) polynomial R. These check vectors are derived from a set of keys which are unique elements of the reduced residue system, wherein each key is associated with a different column of the array. The check vector for a row r of a column c is the product in the reduced residue system of the key for the column c and $a^r$, wherein a is the polynomial x+0. Techniques for using these check bits, where the polynomial P is irreducible so that the check vectors are in $GF(2^x)$, to provide single-bit error correction after a failed component is identified are described in the '961 patent.

Detecting and Correcting Errors in a Block of Data

Figure 2B:
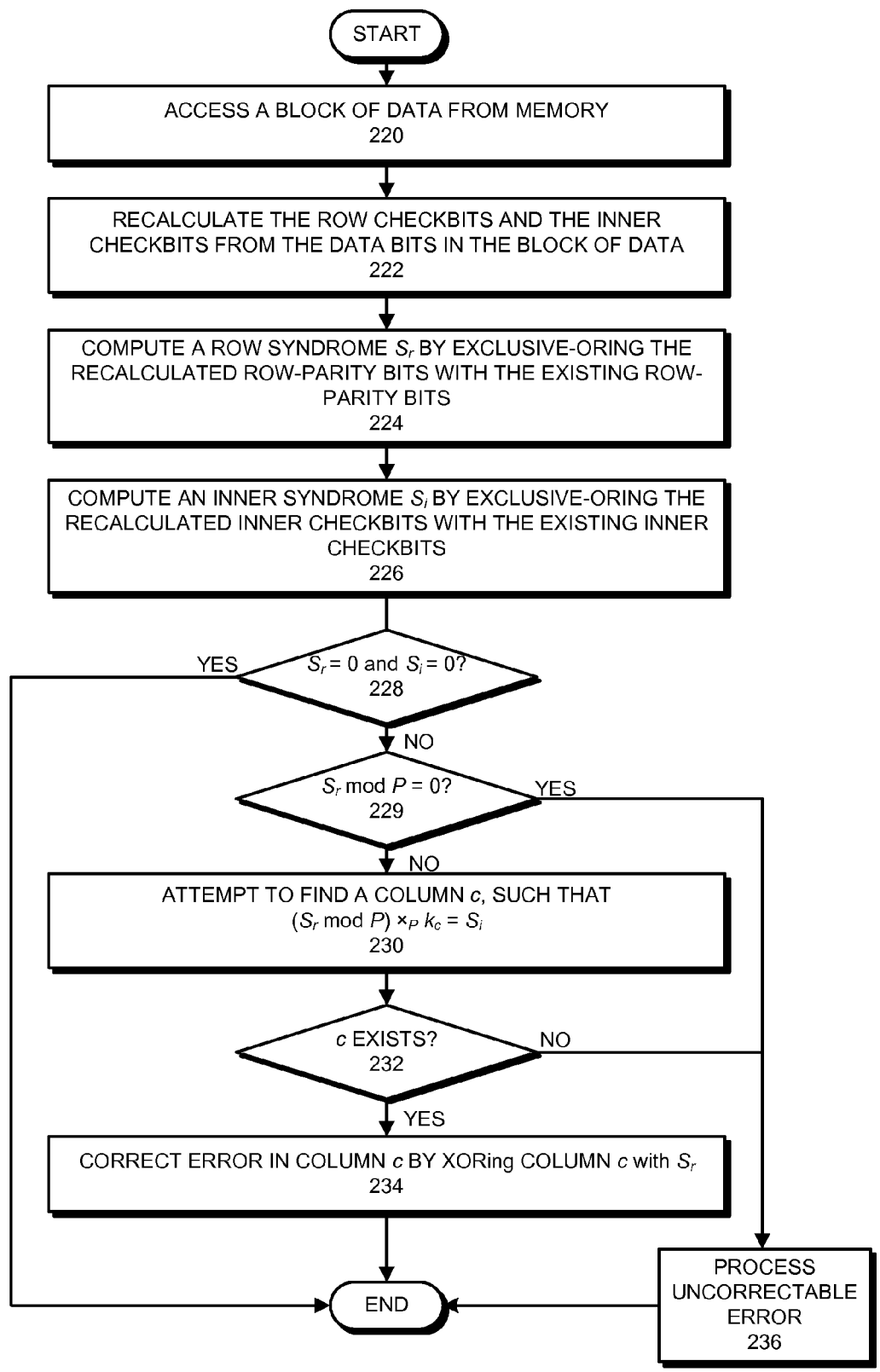
FIG. 2B presents a flow chart illustrating how an error generated by a memory component is detected in accordance with the disclosed embodiments.

FIG. 2B presents a flow chart illustrating how an error in a memory component can be detected and possibly corrected in accordance with the disclosed embodiments. At the start of the process, the system accesses a block of data from the memory (step 220). Next, the system examines the block of data to determine whether there is an error originating from a memory component. This determination involves a number of operations. First, the system recalculates the row-parity bits and the inner check bits from the data bits in the block of data (step 222). Next, the system computes a row syndrome $S_r$ by exclusive-ORing the recalculated row-parity bits with the existing row-parity bits (step 224). The system also computes an inner syndrome $S_i$ by exclusive-ORing the recalculated inner check bits with the existing inner check bits (step 226).

Next, the system determines whether the row syndrome $S_r$ and inner syndrome $S_i$ are both zero (step 228). If so, there is no error and the process is complete. Otherwise, the system determines whether $S_r$ mod P=0 (step 229). If so, there exists an uncorrectable error in the data block and the system takes action to process the uncorrectable error (step 236), which for example can involve throwing an exception.

Otherwise, if $S_r$ mod $P\neq 0$, the system attempts to find a column c, such that $(S_r \text{ mod } P)x_p k_c = S_i$ (step 230) and the system tests to see whether such a column c exists (step 232).

If no such column c exists, there exists an uncorrectable error in the data block and the system takes action to process the uncorrectable error (step 236). Otherwise, if such a column c does exist, we have a correctable error in component c, which is corrected by XORing column c with $S_r$ (step 234).

Handling Memory Component Failures and Additional Errors

Implementation details for techniques and associated circuitry for handling memory component failures and additional errors are described in the '296 patent, the '961 patent, the '580 application, the '976 patent, and the '430 application which have been incorporated by reference in this specification to provide these details.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A memory system that provides error detection and correction, comprising:
   an access mechanism configured to access a block of data from the memory system, wherein each block of data in the memory system includes an array of bits logically organized into R rows and C columns, including C-2 data-bit columns containing data bits, a row check bit column including row-parity bits for each of the R rows in the block, and an inner check bit column including X inner check bits, which are defined to cover bits in the array in accordance with a set of check vectors, wherein each check vector is associated with a different bit in the array and is an element of Res(P), a residue system comprising a set of polynomials with GF(2) coefficients modulo a polynomial P with GF(2) coefficients, wherein each column is stored in a different memory component, and wherein the check bits are generated from the data bits to facilitate block-level detection and correction for errors generated in a memory component; and
   an error-detection circuit configured to,
     examine a block of data retrieved by the access mechanism, and
     determine whether a memory component has generated an error based on the examination.

2. The memory system of claim 1, wherein while examining the block of data, the error-detection circuit is configured to:
   read the block of data, which includes data-bit columns, a row check bit column and an inner check bit column;
   use the data bits in the data-bit columns to regenerate the row-parity bits for the row check bit column and the inner check bits for the inner check bit column;
   compute a row syndrome by exclusive-ORing the regenerated row-parity bits with the existing row-parity bits;
   compute an inner syndrome by exclusive-ORing the regenerated inner check bits with the existing inner check bits; and
   determine whether a memory component has generated an error based on the row syndrome and the inner syndrome.

3. The memory system of claim 2, wherein determining whether a memory component has generated an error includes:
   determining if both the row syndrome and inner syndrome are zero;
   if both the row syndrome and inner syndrome are zero, determining that no memory component has generated an error; and
   if either of the row syndrome and inner syndrome are non-zero, determining if the row syndrome modulo P is zero;
     if the row syndrome modulo P is zero, determining that an uncorrectable error has occurred; and
     if the row syndrome modulo P is non-zero, attempting to use the row syndrome, inner syndrome and column keys to identify a memory component with an error by matching the inner syndrome with a calculated inner syndrome for each component;
       if a memory component cannot be identified, determining that an uncorrectable error has occurred; and
       if a memory component is identified, determining that an error occurred in the identified memory component.

4. The memory system of claim 3, wherein while matching the inner syndrome with a calculated inner syndrome for each component, the error-detection circuit is configured to:
   perform multiplication operations in Res(P) between the row syndrome and each key in the set of keys;
   compare the inner syndrome against results of the multiplication operations; and
   if the inner syndrome matches a result, determine that the key associated with the result is the key for the column associated with the memory component that generated the error.

5. The memory system of claim 3, further comprising an error-handling circuit, wherein after a failed memory component is identified, the error-handling circuit is configured to:
   use the row syndrome to identify erroneous bits in the data-bit column associated with the failed memory component;
   flip the identified erroneous bits to produce the corrected data-bit column; and
   after the corrected column is produced, regenerate the inner check bits for the block of data including the corrected column.

6. The memory system of claim 5, wherein after the corrected column is produced, the error-handling circuit is configured to:
   compare the regenerated inner check bits for the block of data including the corrected column with existing inner check bits; and
   if comparison indicates that there remains an apparent double-bit error wherein both erroneous bits are in the same row and one is in the column associated with the failed component, flip the erroneous bits to correct the apparent double-bit error.

7. The memory system of claim 1, wherein the check vectors are derived from a set of keys that are unique elements of Res(P), wherein each key is associated with a different column of the array, and wherein the check vector for a row r of a column c is the product in Res(P) of the key for the column c and $a^r$, wherein a is an element of Res(P).

8. The memory system of claim 1, wherein CV(x, y) is the check vector associated with the bit at row x and column y of the array, and wherein the set of keys are selected so that for any two distinct rows $r_1$ and $r_2$ and any three distinct columns $c_1$, $c_2$, and $c_3$, $CV(r_1, c_1)$ XOR $CV(r_2, c_2)$ XOR $CV(r_1, c_3)$ XOR $CV(r_2, c_3)$ is not equal to zero.

9. The memory system of claim 1, wherein a key associated with a column $c_y$ is denoted as key($c_y$), and wherein the set of keys are selected so that for any row r, and for any three distinct columns $c_1$, $c_2$ and $c_3$, key($c_1$) XOR key($c_2$) is not equal to the product in Res(P) of key($c_1$) XOR key($c_3$) and $a^r$.

10. The memory system of claim 1, wherein if X<R, the memory system supports probabilistic correction of a single-component error.

11. A computer system, comprising:
   one or more processors;
   a memory system including an access mechanism configured to access a block of data, wherein each block of data in the memory system includes an array of bits logically organized into R rows and C columns, including C-2 data-bit columns containing data bits, a row check bit column including row-parity bits for each of the R rows in the block, and an inner check bit column including X inner check bits, which are defined to cover bits in the array in accordance with a set of check vectors, wherein each check vector is associated with a different bit in the array and is an element of Res(P), a residue system comprising a set of polynomials with GF(2) coefficients modulo a polynomial P with GF(2) coefficients, wherein each column is stored in a different memory component, and wherein the check bits are generated from the data bits to facilitate block-level detection and correction for errors generated in a memory component; and
   a component-error-detection circuit configured to,
      examine a block of data retrieved by the access mechanism, and
      determine whether a memory component has generated an error based on the examination.

12. A method for providing error detection and correction, comprising:
   accessing a block of data from the memory system, wherein each block of data in the memory system includes an array of bits logically organized into R rows and C columns, including C-2 data-bit columns containing data bits, a row check bit column including row-parity bits for each of the R rows in the block, and an inner check bit column including X inner check bits, which are defined to cover bits in the array in accordance with a set of check vectors, wherein each check vector is associated with a different bit in the array and is an element of Res(P), a residue system comprising a set of polynomials with GF(2) coefficients modulo a polynomial P with GF(2) coefficients, wherein each column is stored in a different memory component, and wherein the check bits are generated from the data bits to facilitate block-level detection and correction of errors generated by a memory component;
   examining the accessed block of data; and
   determining whether a memory component has generated an error based on the examination.

13. The method of claim 12, wherein examining the accessed block of data includes:
   reading the block of data, which includes data-bit columns, a row check bit column and an inner check bit column;
   using the data bits in the data-bit columns to regenerate the row-parity bits for the row check bit column and the inner check bits for the inner check bit column;
   computing a row syndrome by exclusive-ORing the regenerated row-parity bits with the existing row-parity bits;
   computing an inner syndrome by exclusive-ORing the regenerated inner check bits with the existing inner check bits; and
   determining whether a memory component has generated an error based on the row syndrome and the inner syndrome.

14. The method of claim 13, wherein determining whether a memory component has generated an error includes:
   determining if both the row syndrome and inner syndrome are zero;
   if both the row syndrome and inner syndrome are zero, determining that no memory component has generated an error; and
   if either of the row syndrome and inner syndrome are non-zero, determining if the row syndrome modulo P is zero;
      if the row syndrome modulo P is zero, determining that an uncorrectable error has occurred; and
      if the row syndrome modulo P is non-zero, attempting to use the row syndrome, inner syndrome and column keys to identify a memory component with an error by matching the inner syndrome with a calculated inner syndrome for each component;
         if a memory component cannot be identified, determining that an uncorrectable error has occurred; and
         if a memory component is identified, determining that an error occurred in the identified memory component.

15. The method of claim 14, wherein matching the inner syndrome with a calculated inner syndrome for each component includes:
   performing multiplication operations in Res(P) between the row syndrome and each key in the set of keys;
   comparing the inner syndrome against results of the multiplication operations; and
   if the inner syndrome matches a result, determining that the key associated with the result is the key for the column associated with the memory component that generated the error.

16. The method of claim 14, wherein after a failed memory component is identified, the method further comprises:
   using the row syndrome to identify erroneous bits in the data-bit column associated with the failed memory component;
   flipping the identified erroneous bits to produce the corrected data-bit column; and
   after the corrected column is produced, regenerating the inner check bits for the block of data including the corrected column.

17. The method of claim 16, wherein after the corrected column is produced, the method further comprises:
   comparing the inner check bits for the block of data including the corrected column with the existing inner check bits; and
   if comparison indicates that there remains an apparent double-bit error wherein both erroneous bits are in the same row and one is in the column associated with the failed component, flipping the erroneous bits to correct the apparent double-bit error.

18. The method of claim 12, wherein the check vectors are derived from a set of keys that are unique elements of Res(P), wherein each key is associated with a different column of the array, and wherein the check vector for a row r of a column c is the product in Res(P) of the key for the column c and $a^r$, wherein a is an element of Res(P).

19. The method of claim 12, wherein $CV(x, y)$ is the check vector associated with the bit at row x and column y of the array, and wherein the set of keys are selected so that for any two distinct rows $r_1$ and $r_2$ and any three distinct columns $c_1$, $c_2$, and $c_3$, $CV(r_1, c_1)$ XOR $CV(r_2, c_2)$ XOR $CV(r_1, c_3)$ XOR $CV(r_2, c_3)$ is not equal to zero.

20. The method of claim 12, wherein if $X<R$, the memory system supports probabilistic correction of a single-component error.

* * * * *